United States Patent [19]

Kwalwasser

[11] 4,111,850

[45] Sep. 5, 1978

[54] ORGANIC PHOTOCONDUCTORS AND METHODS

[75] Inventor: William David Kwalwasser, Harrisburg, Pa.

[73] Assignee: AMP Incorporated, Harrisburg, Pa.

[21] Appl. No.: 769,259

[22] Filed: Feb. 16, 1977

[51] Int. Cl.$^2$ .......................................... H01C 31/00
[52] U.S. Cl. ................................. 252/501; 96/1.5 R; 260/315
[58] Field of Search ....................... 260/315; 252/501; 96/1.5

[56] References Cited

U.S. PATENT DOCUMENTS

| | | | |
|---|---|---|---|
| 3,206,306 | 9/1965 | Neugebauer et al. | 260/315 X |
| 3,287,119 | 11/1966 | Hoegl | 260/315 X |
| 3,811,879 | 5/1974 | Montillier | 96/1.5 |
| 3,849,130 | 11/1974 | Montillier | 252/501 X |
| 3,871,880 | 3/1975 | Montillier | 96/1.5 |
| 4,026,703 | 5/1977 | Hayashi et al. | 96/1.5 |

OTHER PUBLICATIONS

J. Chem. Phys., vol. 63, No. 9, Nov. 1, 1975, pp. 4047–4053.
J. Chem. Phys., vol. 61, No. 8, Oct. 15, 1974, pp. 3002–3008.

*Primary Examiner*—Benjamin R. Padgett
*Assistant Examiner*—E. Suzanne Parr

[57] ABSTRACT

Carbazole-based molecular photoconductive charge-transfer complexes are synthesized which are easily applied to electrode substrates. The carbazole-based complexes comprise 3-substituted carbazoles complexed with an electron acceptor molecule such as 2,4,7-trinitrofluorenone. In addition, the photoconductive response of polyvinylcarbazole-trinitrofluorenone complexes is improved by substitution of certain functional groups on the aromatic portions of the polymer. Also provided are methods for constructing photoconductive elements on thin semitransparent flexible substrates for use in many areas such as light sensitive switching functions, the photoconductors being applied from solution or suspension in a fast drying liquid onto an electrode assembly attached to a flexible plastic substrate.

19 Claims, No Drawings

ORGANIC PHOTOCONDUCTORS AND METHODS

BACKGROUND OF THE INVENTION

1. Field of the Invention

This invention is concerned with certain novel carbazole-based molecular photoconductive charge-transfer complexes, and more particularly to methods for synthesizing these carbazole-based molecular photoconductive charge-transfer complexes and their application to electrosubstrates, as well as methods for constructing photoconductive elements on thin semitransparent flexible substrates.

2. DESCRIPTION OF THE PRIOR ART

Carbazole-nased materials such as polycarbazoles are well known in the prior art as photoconductive materials and many photoconductive elements have been prepared and used employing polyvinyl carbazole and related materials. As shown in U.S. Pat. No. 3,162,532 for example, polyvinylcarbazole is an ultraviolet photoconductor and its light response can be greatly enhanced and sensitized into the visible by complexing with an aromatic charge-transfer acceptor such as 2,4,7-trinitrofluorenone. This discovery has extended the scope of organic electrophotography and various articles have been published and patents issued in this field.

The prior art contains a large body of patents and articles concerned with the preparation and use of materials prepared from carbazoles. A main photoconductor of interest has been a polyvinylcarbazole polymer prepared fron N-vinylcarbazole which has been found to function in a useful manner in photoconductive layers. It is also known to form complexes of polyvinylcarbazoles with an electron acceptor such as 2,4,7-trinitro-9-fluorenone for use in photoconductive applications. A complex of this type is disclosed for example in U.S. Pat. No. 3,666,458.

In addition, the photosensitization of poly N-vinylcarbazoles has been studied as shown for example by Hoegl et al, "Photochemistry and Photobiology", 1972, Vol. 16, pps. 335-352, and in "Photographic Science and Engineering", Vol. 14, No. 3, May-June, 1970, pps. 205-209. Further, in an article by Schaffert in IBM J. of Research & Development, January, 1972, pps. 75-89, there is set forth a discussion of an organic photoconductor consisting essentially of the reaction product of 2,4,7-trinitro-fluorenone with poly-N-vinylcarbazole. Further, the photoelectric affects in polymers and their sensitization by doping materials was studied in "Journal of Physical Chemistry", by Hoegl, Vol. 69, No. 3, March 1965 at pps. 755-765.

The prior art has also been concerned with electrophotographic materials of this type formed by substitution by various substituents on aromatic portions of the carbazole molecule. For example U.S. Pat. No. 3,575,698 discloses brominated poly-N-vinylcarbazoles, and U.S. Pat. No. 3,848,237 discloses organic photoconductors comprising polymerized vinylcarbazoles which are reacted with trinitrofluorenone. In addition, in U.S. Pat. No. 3,627,524, chlorine-substituted poly-9-vinylcarbazole photoconductor polymers and copolymers were studied which were substituted in the 3-position by chloro or in the 3- and 6-position by chlorine atoms. A similar prior U.S. Pat. No. 3,705,031 discloses electrophotographic photosensitive materials which contain chlorine and bromine substituted 9-vinylcarbazole units. A similar disclosure including chloro- and iodo- substituents may be found in U.S. Pat. No. 3,702,764. In U.S. Pat. No. 3,421,891, polyvinylcarbazoles containing bromo substituents in the 3- and/or 6-position were studied as electrophotographic materials, and U.S. Pat. No. 3,595,648 discloses organic photoconductive materials comprising poly-N-vinyl-3-nitroso carbazoles together with copying paper prepared using this material.

In U.S. Pat. No. 3,485,624 there is disclosure of a photoconductive coating containing poly-N-vinylcarbazole obtained by heat treating the coatings at elevated temperatures to improve the photographic speed. Similarly, in the progression of the art, U.S. Pat. No. 3,684,506 discloses dimers of N-alkenylcarbazoles wherein the carbazole groups may also contain substituents such as alkyl, aryl, cycloalkyl, alkaryl, cyano, carboxylic acid or amino groups. Similarly, U.S. Pat. No. 3,526,502 discloses photoconductive materials comprising polymeric compounds such as poly-N-vinylcarbazole and brominated materials of this type, and U.S. Pat. No. 3,552,959 relates to electrophotographic copying paper using poly-N-vinylnitrocarbazole as an organic photoconductive material.

In U.S. Pat. No. 3,697,264, photoconductive carbazole polymers are described which have recurring polyvinylcarbazole units wherein the aromatic portion of the molecule may be substituted, particularly in the 3-position, by a substituent such as alkyl, aryl, cycloalkyl, halogen or hydrogen. Also, a similar polyvinylcarbazole substituted in the 3-position by an azo radical is disclosed in U.S. Pat. No. 3,583,869. Further, in British Pat. No. 1,254,217, there are disclosed organic photoconductive materials and electrically conductive layers containing these materials which comprise a substituted polyvinylcarbazole wherein the substituent may be hydrogen, chlorine, bromine, iodine, or nitro.

In German Offenlegungsschrift Nos. 2,313,632 and 2,360,102 there are disclosed bis-carbazoles and complexes of these bis-carbazoles with electron acceptors such as 2,4,7-trinitro-9-fluorenone and 2,4,5,7-tetranitro-9-fluorenone.

U.S. Pat. No. 3,811,879 discloses photoconductive insulating coating compositions which include a crystallization prevention agent. In this system, there is used a charge-transfer agent comprising the complex of a poly-N-vinylcarbazole and trinitrofluorenone material and this charge-transfer complex is improved by increasing the trinitrofluorenone content. None of the polyvinylcarbazoles used have substituents on the organic portions of the molecule.

The present invention provides improved organic charge-transfer complexes which may be applied either as smooth polymer layers or as microcrystalline molecular compounds embedded in an inert binder. A charge-transfer complexes comprise the reversible formation of a larger chemical entity by the association of two molecules and visually exhibiting a visible light absorption, extra to the absorption of the separate components, which is the result of an intermolecular transfer of charge from one molecule, the donor, to the other, the acceptor.

SUMMARY OF THE INVENTION

It is accordingly one object of the present invention to provide carbazole based molecular photoconductive charge-transfer complexes containing substituents on the aromatic portion of the molecule.

It is a further object of the present invention to provide substituted carbazole based molecular photoconductive charge-transfer complexes which are easily applied to electrode substrates in microcrystalline form embedded in a polymeric binder matrix.

A still further object of the present invention is to provide novel polyvinylcarbazole-fluorenone complexes which contain aromatic substituents of certain functional groups on said polymer, which functional groups raise the photoconductive characteristics of the polymer complex.

An even further object of the present invention is to provide a method for constructing photoconductive elements on thin semitransparent flexible substrates which have metallized electrodes and contacts.

Other objects and advantages of the present invention will become apparent as the description thereof proceeds.

In satisfaction of the foregoing objects and advantages there are provided by this invention carbazole-based molecular photoconductive charge-transfer complexes, said complexes comprising the reaction product of an electron acceptor molecular with an N-alkyl carbazole, said N-alkyl carbazole containing a substituent in the 3-position selected from the group consisting of nitro, dibenzylamino, acetylamino, cyano, methoxy, iodo bromo, and diphenylamino, said complexes being crystalline colored complexes suitable for easy application to electrode substrates in microcrystalline form embedded in a polymeric binder matrix.

The present invention also provides improved polyvinylcarbazole-electron acceptor complexes which have improved photoconductive response, said improved response being the result of substitution of a functional group into the aromatic ring of the polyvinylcarbazole, said resulting polymers being suitable for coating onto an electrode from a suitable solvent to provide an organic layer capable of carrying up to 20 microamperes of photoinduced current at 50 volts.

Further provided by the present invention is a method for constructing photoconductive elements on thin semitransparent flexible substrates which have metallized electrodes and contacts wherein all circuit connections are made in a single step including electrode formation, by a process comprising depositing material electrodes and associated circuitry on a flexible substrate, plating the electrodes with an appropriate electrode metal, applying one of said photoconductive materials to said substrate by placing in flexible form with a suitable binder, applying to said substrate as a thin layer from suspension or solution, then applying light-reflecting materials over the photoconductive matrix to increase light absorption in the device, and illuminating from the opposite side of the substrate so as to provide a resulting flexible two-dimensional package, the active surface being environmentally protected and easily integratable into compatible circuitry.

DESCRIPTION OF PREFERRED EMBODIMENTS

As indicated above, the present invention is concerned with the discovery of certain new carbazole-based photoconductive charge-transfer complexes which are easily applied to electrode substrates from organic solvent solutions or suspensions. Moreover, the present invention provides carbazole based complexes wherein the photoconductive response has been improved with the substitution by certain functional groups in the aromatic portion of the polymer. Further, the present invention provides a new method of constructing photoconductive elements on thin semitransparent flexible substrates.

According the present invention, carbazole based molecular photoconductive charge-transfer complexes have been synthesized which are easily applied to electrode substrates from organic solvent solutions or suspensions.

One group of new photoconductive materials is applied in microcrystalline form from suspension and it has been found that these microcrystalline photoconductors have better electrical response than bulk ones due to the high surface area of the finely divided particles. These crystalline, stable charge transfer complexes comprise a new class of photoconductor materials.

These microcrystalline photoconductors are prepared in general by the reaction of an N-alkylcarbazole with appropriate reagents to form a 3-substituted carbazole intermediate of the following general formula:

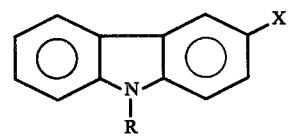

wherein, in the above formula, X is selected from the group consisting of notro, dibenzylamino, acetyl, amino, cyano, methoxy, iodo and diphenylamino, and R is alkyl of 1 to about 4 carbon atoms but preferably ethyl.

Also included with this class of compounds are the bis-carbazole derivatives having the following general formula:

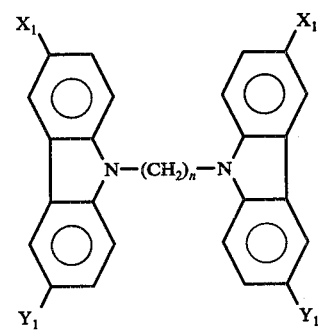

wherein $X_1$ and $Y_1$ are selected from the group consisting of hydrogen, bromo, and methyl, of $X_1$ is hydrogen when $Y_1$ is methoxy or iodo, and n is an integer of 3,4 or 5.

These 3-substituted derivatives of N-alkyl carbazoles are prepared as set forth in the accompanying working examples. In general, the synthesis involves reaction with an appropriate reagent which will provide the desired substituent on the N-alkyl carbazole, preferably N-ethylcarbazole, in a reaction medium under the reaction conditions indicated in the working examples. Certain of these substituted N-alkylcarbazoles are believed to be novel compounds and are claimed as such herein.

The bis compounds are prepared by reaction of the substituted carbazoles with 1,3-dihalopropane, 1,4-dihalobutane or 1,5-dihalopentane to prepare the appropriate bis-1,3- or 1,4- or 1,5-N-carbazolylpropanes, -butanes, and -pentanes, or by reacting unsubstituted bis-1,3-, or 1,4- or 1,5-N-carbazolyl-propanes, -butanes and -pentanes with the appropriate reagent to add the desired substituent. Reactions for preparation of these compounds are also set forth in the accompanying working examples.

The resulting intermediate carbazoles are then complexed with an electron-acceptor molecular including any of those well known to the art (see U.S. Pat. No. 3,811,879), but preferably a fluorenone selected from the group consisting of 2,4,7-trinitrofluorenone, and 2,4,5,7-tetranitro-9-fluorenone, in order to form complexes of the donor carbazole with the electron acceptor. The complexes are formed in general by reaction of substantially equimolar proportions of the carbazole and electron acceptor in a hot solution and recovering the complex on cooling as a precipitate. It is a feature of the present invention that the resulting complexes are crystalline highly-colored complexes because of a charge transfer absorption in the visible region of 450–600 nm. The complexes of N-alkylcarbazole may be ground to microcrystalline form, for example to about 0.3 micron particle size by conventional grinding means such as a steel-ball mixer and then suspended with agitation in a solution of an appropriate polymer binder in an organic solvent from which the conductive coating is applied. Suitable polymer binders include poly-n-butyl/isobutyl methacrylate, sold under the tradename Elvacite by DuPont, or polyvinylketone (PVK) binders. Organic solvents which may be used include tetrahydrofuran and benzene. However, equivalent binders and solvents may be used. The resulting mixture should have a concentration of about 7–15% solids content for subsequent use.

In one embodiment for use of these carbazole-based molecular photoconductive complexes the 7–15% solution may be coated onto a conductive substrate by conventional means such as by use of a doctor blade and then drying the resulting substrate preferably to a dry thickness to between 2 and 40 microns. Counter electrodes may then be applied on top of the coating by evaporation. The resulting cells function as current carrying devices under light stimulation and applied voltage of up to 100 volts, the photocurrents thereby induced being on the order of microamperes/cm².

The present invention also provides a method for improving the photoconductive response of complexes resulting from the reaction of poly-N-vinylcarbazoles and electron acceptors such as those described above, e.g. 2,4,7-trinitrofluorenone, by the substitution of certain functional groups on the aromatic portion of the polymer. It has been found that these functional groups substantially raise the photoconductivity of the polymer complex but not the dark current when placed between two metal electrodes so that under voltages common to electronic circuitry (0–120 V), they pass sufficient current to act as switching elements.

These improved poly-N-vinylcarbazole polymers generally comprise the reaction product of poly-N-vinylcarbazole substituted in the 3-position by a functional group which is then complexed with an electron acceptor molecule. The poly-N-vinylcarbazoles which form the complexes of this embodiment are of the following formula.

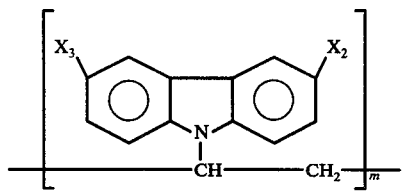

wherein, $X_2$ is a functional group selected from the group consisting of bromo, iodo amino, N,N-dibenzylamino, cyano, diphenylamino, formyl, acetyl, methyl, methoxy, nitro and N-acetylamino, $X_3$ is hydrogen, or bromo, when $X_2$ is bromo, and m is an integer indicating the length of the polymer or degree of polymerization.

The 3-substituted poly-N-vinylcarbazole polymers are formed by reacting the basic unsubstituted poly-N-vinylcarbazole molecule with a reagent which will provide the desired substituent. The poly-N-vinylcarbazole polymer is well known in the art and available commercially (see U.S. Pat. No. 3,811,879). For example, in the formation of the bromo-substituted poly-N-vinylcarbazole, the polymer is reacted with N-bromosuccinimide. The reactions are conducted under the reaction conditions and using the reagents as set forth in the accompanying examples which sets forth procedures for preparation of these poly-N-vinylcarbazole substituted materials. Certain of these compounds are believed to be novel and are claimed herewith as new compounds.

The complexes with the electron acceptors, such as those described above, are then formed by dissolving in an appropriate solvent such as tetrahydrofuran, along with an equimolar portion of the complexing agent such as nitro-substituted fluorenone, and can be recovered by evaporation of the solvent.

These poly-N-vinylcarbazole-electron acceptor complexes may then be applied directly from the complexing solvent solution by coating on an electrode material, e.g. glass coated with tin oxide, or flexible Mylar or Kapton strips coated with a metal, then dried in air, heated in a vacuum up to about 80° C., and depositing counter electrodes on top by evaporation. The resulting organic layer is generally about 5 to 20 microns thick. These cells are capable of carrying up to 20 microamperes photoinduced current at 50 volts.

In a further embodiment of the present invention there is also provided a method for constructing photoconductive elements on thin semitransparent flexible substrates which have metallized electrodes and contacts such as the semitransparent flexible substrates prepared with the organic photoconductors disclosed herein. It is an advantage of the method of the present invention that all circuit connections can be made in one step including electrode formation and that the thin photoconductive layer can be applied over the electrodes in a single operation thus obviating the need to vacuum deposit a counter electrode and attach a circuit lead to it.

In conducting the method of the present invention in constructing photoconductive elements, two metal electrodes and associated circuitry are deposited on a flexible substrate such as Mylar or Kapton, which consists of a comb cell (two interlocking combs of ca. 400 digits each). The electrodes may be plated up with any appropriate electrode metal as known in the art. The photoconductive materials as described herein are then placed into a flexible form by combining with a suitable binder. These mixtures are then applied to the substrate as a thin layer from the solution or in the case of an epoxy binder, in the precured form. Light reflecting materials are then applied over the photoconductive matrix to increase light absorption in the device which is illuminated from the opposite side of the substrate. The resulting two dimensional package is flexible, the active surface being environmentally protected and easily integratable into compatible circuitry.

As indicated above, the imporved N-alkylcarbazole derivatives, substituted poly-N-vinylcarbazole polymers, and is-carbazolyl-compounds have been found to be particularly suitable as photoconductors when complexed with a trinitrofluorenone electron acceptor for use in the process of the present invention. The resulting complexes are highly colored because of a charge-transfer absorption in the visible region of 450–600 nm which appear to be humps superimposed on the large tail-off absorptions above 350 nm for carbazole and for trinitrofluorenone (TNF).

The products of the present invention containing substituents in the 3-position were found to provide numerous advantages in use as photoconductors in the areas indicated. Thus, the substituents present on the carbazole ring enhanced photogeneration and improved adjacent carbazole ring overlap thereby increasing carrier mobility. It was further found that while substitution with the electron-donating substituents decreased the ionization potential, that this led to more efficient photogeneration of charged carriers in charge transfer complexes due to increased stability of the carbazole-hole carriers. These effects were found to be due in part to increased light sensitivity and complex stability and parallel increases in photoconductivity observed upon increasing electron affinity of acceptors using the poly-N-vinylcarbazole donors.

The organic photoconductors of the present invention are advantageous over prior art materials such as inorganic photoconductors since they are less expensive to synthesize, do not need to be ultra pure nor involve expensive single crystal fabrication. Moreover, they are more easily tailored to meet specific desired photoabsorption and photoconductivity parameters. Further, application of the complexes may be made from solution (polymers) or liquid suspension (Microcrystalline), to electrode substrates in a continuous process to give smooth, flexible layers. Further, the ability to synthesize directly a crystalline complex between donor and acceptor (with defined intermolecular structure) which increases both mobility and carrier photogeneration, and thereby increase photoconductivity is particularly advantageous.

The photoconductors of this invention can be applied to electrodes for measurement in either of two forms, as smooth films or as particulate suspensions by the following procedures:

Smooth Films - Tetrahydrofuran (THF) solutions of the poly-N-vinykcarbazole (PVK), and its derivatives and the charge-transfer complexes of these polymers with equimolar amounts of TNF may be applied in this manner. Included in this category are the N-ethylcarbazole derivatives, wherein X is dibenzylamino or diphenylamino, dissolved in benzene solutions of poly-n-butyl/isobutyl methacrylate (Elvacite ®) or PVK polymeric binders. In the lattar cases, the percent carbazole in total solids used was 65% or less. At higher loadings (71%), photoconductor crystallization set in before drying Elvacite ®, thereby breaking up the smooth film.

Freshly prepared solutions, ususally stirred two hours to ensure dissolution of polymer, of 7 to 13% solids were applied to one-inch squares of tin-oxide coated (NESA) glass (nominal 100 ohms/square). These had been cleaned by wiping with a tetrahydrofuran (THF) dipped cotton swab, rinsing with THF, $CH_2Cl_2$, and forced notrogen drying. Application of solution was via syringe, through a 1.5 micron-pore size solvinert $^{TM}$ Millipore filter, and the solutions were spread on NESA Plates to 2 to 6 ml thickness using a Gardner Knife (Gardner Lab., Bethesda, Maryland). After drying under a cover plate, the cells were heat cured in a vacuum ($1 \times 10^{-4}$ atmospheres):

1. At 90° C. for 2 to 3 hours for PVK derivatives;
2. At 80° C. for 15 minutes or 60° C. for one-half hour for PVK:TNF complexes;
3. At ca 40° C. for 1 hour for N-ethylcarbazole derivatives.

Gold (99.999%) counter electrodes (6.0 mm diameter) were then applied through a mask in a vacuum of $2.6 \times 10^{-9}$ atmospheres, by heat evaporation from a 5 ml molybdenum-boat electrode at <10V and 65A. The average gold thickness was 0.26 microns. The vacuum was created via oil-diffusion pump and had a liquid-nitrogen cooled baffle, and measurements showed no back-diffusion of oil onto the substrate over the course of the deposition.

Particulate Suspensions — Charge transfer TNF complexes of N-ethylcarbaziole derivatives, where X = nitro, cyano, acetylamino, diphenylamino, and dibenzylamino; and TNF complexes of bis-1,3(N-carbazolyl)propane derivatives are applied in this manner,.

Generally, 0.100g of the crystalline photoconductor was ground in a 2 ml stainless steel container fitted with a teflon O-ring seal and a steel ball (Spex Industries, Methuchen, New Jersey). The substrate was ground to a fine powder for 10 minutes via high-velocity rocking motion on a Spex vibrator. A suspension of this material in a elvacite ® (DuPont methacrylate resin 2046) or PVK benzene solution, in 7 to 15% total solid concentration (mostly 8 to 10%), was prepared by addition of a calculated amount of polymer solution to the photoconductor powder and shaking on the vibrator for 10 minutes. These suspensions were stable to settling for up to one hour. The amount of polymer solution added was calculated to make the fraction of photoconductor to total solids 73%. Independent experimentation had determined that thin layers of suspended particles in PVK cracked and peeled when photoconductor weight percent was below 60. In Elvacite ®, though, loadings as low as 26% were measured without cracking. This is because of the relative cohesive ability and stiffness of the two polymers.

The application of these suspensions to NESA plates was as described above, except that they were not filtered. They were spread on the plates to 3 to 6 mil wet thickness, and dried in air, and then by vacuum (no heat). The thermomechanically measured dry thickness was 8 to 25 microns. Microscopic estimation of average crystal size is ca 0.3 microns, with a very uniform particle distribution over the surface. Each photoconductor had its own optimum solvent/polymer mixture ratio according to the crystal structure. Making the mixtures too thick allows the polymer to agglomerate due to fast solvent evaporation, causing uneven photoconductor particle distribution and clumping, consequent voids in the photoconductor/polymer structure, and shorting of thin cells.

In view of the photoconductive advantages provided by the substituted carbazoles of the present invention in the photoconductor field, they find promising use in fixed-potential batteries; in emitter detectors for electrical line installation or entry into light pipe connectors by a bi-stable switch; in gas detectors as infrared radiation absorbers or detectors such as in cameras, and in many other fields wherein photoconductors having the characteristics of the products of this invention may be used.

As mentioned above, the products of the present invention find particular utility in construction of photoconductive elements on thin semitransparent flexible substrates which have metallized electrodes and contacts. It is particularly advantageous that all circuit connections can be made in one step including electrode formation by applying a thin photoconductive layer by one of the methods described over the electrodes in a simple operation thereby obviating the need to vacuum deposit a counter electrode and attach a circuit lead to the counter electrode.

The following examples are presented to illustrate certain embodiments of the present invention but the invention is not to be considered as limited thereto. In these examples and throughout the specification parts are by weight unless otherwise indicated.

EXAMPLES

In the initial examples, two different types of polyvinylcarbazole compounds were prepared, one polyvinylcarbazole being prepared as a free radical emulsion polymer, and the other as a relatively low molecular weight polymer made by a cationic process. These polyvinylcarbazoles are identified as polyvinylcarbazole I and polyvinylcarbazole II.

EXAMPLE 1

Polyvinylcarbazole (I), free radical emulsion polymer, was recrystallized from benzene/methanol two or four times (for synthetic or electrical use). It's intrinsic viscosity was $0.56 \pm .02$, viscosity average molecular weight was $404,000 \pm 30,000$ (by viscometry), and its weight-average molecular weight was ~600,000 (universal calibration via gpc).

EXAMPLE 2

Polyvinylcarbazole (II), was a relatively low molecular weight polymer, made via a cationic process, and was recrystallized from benzene/methanol twice. Its intrinsic viscosity was $0.21 \pm 0.01$, viscosity average molecular weight was $72,500 \pm 5,000$ (viscometry), and its weight average molecular weight was 84,400. By X-ray analysis, this polymer had a sulfur content of ca 40 ppm.

EXAMPLE 3

Poly(N-vinyl-3,6-dibromocarbazole). A solution of 2.5 g. of polyvinylcarbazole I (12.9 meq), 4.65 g of freshly recrystallized (water) N-bromosuccinimide (26.1 mmol), and 53 mg benzoylperoxide initiator in 85 ml chlorobenzene was heated and stirred via an oil bath at 83°–92° C for 3½ hours under a nitrogen atmosphere. The cooled solution was filtered of 2.24 g (22.9 mmol) succinimide, mp 124°–7° C, and the mother liquor was added dropwise to 400 ml methanol. The solid product was filtered and recrystallized from chlorobenzene/methanol, and dried at 55° C under vacuum. Yield was 3.95 g (87%) of light yellow dibromo compound; analysis for $(C_{14}H_9NBr_2)_x$: Cal'd: Br, 46%; Found: Br, $51.4 \pm 5\%$.

EXAMPLE 4

Poly(N-vinyl-3-iodocarbazole). A mixture of 4.00 g polyvinylcarbazole I (20.6 meq) and 13.0 g iodine (51.0 mmol) was heated, with stirring under a nitrogen atmosphere, in a solution of 25 ml of pyridine and 25 ml of chlorobenzene at 125°–35° C for 9½ hours. The cooled thick solution, deep purple in color, was added slowly to 300 ml methanol. The supernatant liquid was decanted and 200 ml fresh ethanol added. Product was filtered off, air dried, and redissolved in pyridine/chlorobenzene. Iodine was removed via washing with 5% aqueous sodium thiosulfate, followed by washing with saturated sodium chloride solution, and water. The organic layer was added slowly to 600 ml methanol and product filtered off, air dired, recrystallized from tetrahydrofuran/methanol, and vacuum dried at 58° C; analysis for $(C_{14}H_{10}NI)_x$: Cal'd: I, 39.8%; Found: 34.1% or % iodine uptake = 86%.

EXAMPLE 5

Poly(N-vinyl-3-nitrocarbazole). To a rapidly stirring solution of 9.83 g polyvinylcarbazole I (50.9 meq) in 185 ml chlorobenzene and 25 ml acetic acid, 1.36 g (15.1 mmol) of 70% nitric acid was added dropwise. The solution was heated via oil bath to 45° C for 2½ hours. Upon cooling, it was gravity filtered into 800 ml rapidly stirring methanol. After vacuum drying, the light yellow powder was twice recrystallized from tetrahydrofuran (filtering off insolubles)/methanol. Product was dried in a vacuum, 8.24 g; analysis for admixture of $(C_{14}H_{11}N$ and $C_{14}H_{10}N_2O_3)_x$: Found: C, 84.24; H, 5.33; N, 7.96% from which the % nitration is calculated to be $15.7 \pm 2\%$.

One other nitrated polyvinylcarbazole I polymer was prepared (analysis: Found: C, 84.24; H, 5.33; N, 7.96%) with $39.2 \pm 4\%$ nitro groups, by the above procedure. This appears to approach the limit of nitration of this molecular weight polymer, since much insoluble overnitrated and oxidized bi-product was ioslated (~27% by weight).

EXAMPLE 6

Also prepared via the above nitration procedure was a once recrystallized (tetrahydrofuran/methanol) nitrated polymer from polyvinylcarbzole II. This polymer was found to be more soluble than the I polymer, at a higher nitro content, and so was used for photoconductivity and further synthetic work. Percent nitration was assessed by comparison of uv and analytical data of the three prepared polymers. The absorption at 258, 284, 316, 327, and 374 nm were found to be dependent on nitro-content. Linear or semilog plots of the latter versus $e_{max}$ for the 316 and 374 nm absorpitons (most sensitive wavelengths) gave parallel lines, from which the nitro-content of the I polymer is 31%.

| %NO₂ | Max | $e_{max}$ |
|---|---|---|
| 39.1 | 316 | 4,800 |
|  | 374 | 3,300 |
| 15.7 | 316 | 3,400 |
|  | 374 | 1,800 |
| I Polymer (Ex.2) | 316 | 4,300 |

| -continued | | |
|---|---|---|
| %NO$_2$ | Max | $\epsilon_{max}$ |
| | 374 | 2,800 |

EXAMPLE 7

Poly(N-vinyl-3-acetylaminocarbazole). A suspension of yellow 31% nitrated polyvinylcarbazole I (prepared as in Example 6), (8.94 meq NO$_2$) in a 120 ml acetic acid, 20 ml concentrated hydrochloric acid mixture was refluxed with 5 g granulated tin (41.6 mmol) for 15 min. in air. The reaction mixture became tan. Upon cooling, 10 ml of water was added, and the mixture was filtered, washed copiously with water, and air dried.

The poly)N-vinyl-3-aminocarbazole) intermediate was dissolved in 100 ml of pyridine with 3 ml of acetic anhydride and the solution was heated to 50°–60° C. Upon cooling, an insoluble gel was filtered off, and the filtrate added dropwise to 200 ml of rapidly stirring methanol. The finely precipitated green product was washed with methanol and dried in vacuum at 45° C.

N-Ethylcarbazole Derivatives

N-Ethylcarbazole, used as starting material, either synthesized (via ehylation of carbazole with ethyliodide in strongly alkaline aqueous acetone, mp 76° C), or purchased, had a sulfur content >500 ppm by X-ray analysis.

EXAMPLE 8

3-Nitro-N-ethylcarbazole. A solution of 7.3 g of 70% nitric acid (81.1 mmol) in 50 ml acetic acid was added dropwise to a cooled (19°–21° C) acetic acid (200 ml) solution of 15.0 g of N-ethylcarbazole (76.9 mmol). The green reaction solution was then heated on a water bath at 40° C for 2 hours. Upon cooling, addition to 400 ml of water gave a light green precipitate wgich was filtered and air dried. Recrystallization from acetone/methanol gave 13.1 g (71% yield) of 3-nitro-N-ethylcarbazole, mp 118.5°–20° C; the sulfur content (X-ray) was found to be <20 ppm, so that the sulfur in N-ethylcarbazole must be in the elemental or organic (no inorganic) form, most likely the latter, and is easily oxidized to a water soluble form.

EXAMPLE 9

3-Amino-N-ethylcarbazole. A solution of 10.2 g of 3-nitro-N-ethylcarbazole (42.5 mmol) and 38.4 g of stannous chloride dihydrate (170 mmol) in 100 ml of concentrated hydrochloric acid was heated for 3 hours at 92° C. The ice cooled solution was (cautiously) made basic by partial addition of a solution of 75 g sodium hydroxide in 150 ml of water. The product was filtered off and washed with the above base solution, followed by copious amounts of water, and then air dried. Vacuum drying and recrystallization from pyridine/water gave 7.4 g light-green needles (82% yield) mp b 109°–11° C.

EXAMPLE 10

3-Acetylamino-N-ethylcarbazole. To a solution of 3.9 g (18.6 mmol) of the above amine in 10 ml cold (0° C) pyridine was added 1.75 ml of acetic anhydride (18.6 mmol), and the solution was stirred under nitrogen for one-half hour. After adding 20 ml of water, tan microcrystals were filtered off, washed with water, and air dired. Two recrystallizations from benzene/ethanol, followed by dissolution in hot acetonitrile, clarification with Norit charcoal, filtration through Celite 545, addition of water, and cooling gave 2.5 g of off-white needles of 3-acetylamino-N-ethylcarbazole, mp 195°–7° C.

EXAMPLE 11

3-Dibenzylamino-N-ethylcarbazole. A mixture of 2.1 g of 3-amino-N-ethylcarbazole (10.0 mmol), 9.71 g of benzylchloride (76.5 mmol) and 6.1 g anhydrous potassium carbonate (45 mmol) was heated under nitrogen with stirring in 20 ml pyridine (distilled from calcium oxide) at 70°–80° C for 9 hours. The cooled mixture was quenched in 50 ml water and brought to pH 6 with 4N hydrochloric acid. A brown solid (0.1 g, mp 148°–52° C) was filtered off and the filtrate was extracted with three 30 ml portions of benzene. After washing with two 50 ml portions of water, it was dried over sodium sulfate, evaporated to an oil, and chromatographed on a ¾ by 11 inch silica gel (100-200 mesh) column. Eluted with the first 250 ml of a 1:1 mixture of benzene/petroleum ether was 2.15 g of product. Recrystallization twice from acetonitrile/water (5:1), with Norit charcoal clarification the first time, gave 1.6 g of lemon-yellow needles, mp 123°–5° C. Analysis for $C_{28}H_{26}N_2$: Cal'd: C, 86.11; H, 6.71; N, 7.17%. Found: C, 85.67; H, 6.96; N, 7.17%.

EXAMPLE 12

3-Iodo-N-ethylcarbazole. N-ethylcarbazole (12.0 g, 61.5 mmol) and iodine (39 g, 154 mmol) were heated together in 100 ml of pyridine up to 135° C for 4 hours, under a nitrogen atmosphere. Upon cooling, 500 ml of water was added. The lower layer was withdrawn and washed with three 200 ml portions of 4N hydrochloric acid, after addition of 300 ml of chloroform. Precipitated iodine was filtered off, and the filtrate was washed repeatedly with saturated aqueous sodium iodide, unti practically colorless. After washing twice with 200 ml water, the chloroform was evaporated and the residue crystallized from ethanol/benzene to give 11.5 g, mp 75°–9° C. Recrystallization from chloroform/pentane (1:2) gave 2.1 g of yellow 3,6-diiodo-N-ethylcarbazole, mp 139°–45° C.

Partial evaporation of the mother liquor and further addition of pentane yielded 6.8 g of colorless 3-iodo-N-ethylcarbazole, mp 78°–80° C.

EXAMPLE 13

3-Diphenylamino-N-ethylcarbazole. A mixture of 1.93 g of 3-iodo-N-ethylcarbazole (6.00 mmol), 1.10 g of diphenylamine (6.25 mmol), 1.8 g of potassium carbonate (13 mmol), and 0.5 g of copper metal flakes (Cu 5000, US Bronze Powder, Inc.) was heated very strongly in 20 ml nitrobenzene for 14 hours, allowing 12-16 ml of solvent to slowly distill as an azeotrope with water during that period (every 5 or 6 hours, 5 mil fresh nitrobenzene was added). Upon cooling, 70 ml of water was added and the nitrobenzene distilled as a water azeotrope. The brown solid residue was dissolved in 100 ml of benzene, filtered through Celite 545, washed with water, dried over sodium sulfate, and saturated with anhydrous hydrogen chloride. Diphenylammonium chloride was filtered off, the filtrate boiled to 10 ml, and 30 ml ethanol was added. Brown product, mp 40°–60° C, was filtered off. Chromatography on 60 g of silica gel (60-200 mesh), and elution with 400 ml of 10-15% benzene/petroleum ether gave 1.5 g of a yellow oil. This was recystallized from ethanol/benzne/petroleum ether at 0° C, followed by two recrystallizations from 1:1 acetonitrile/water to give lustrous white needles, mp 132.5°–5° C; analysis for $C_{26}H_{22}N_2$: Cal'd: C, 86.16; H, 6.12; N, 7.73%. Found: C, 85.67; H, 6.18; N, 7.96%.

EXAMPLE 14

3-Cyano-N-ethylcarbazole. A mixture of 1.60 g of 3-iodo-N-ethylcarbazole (5.00 mmol) and 0.65 g cuprous cyanide (added in two portions, 7.22 mmol) in 12 ml of distilled (over calcium oxide) dimethylacetamide was refluxed under a nitrogen atmosphere for 4 hours. The mixture was quenched in 25 ml of 15% aqueous sodium cyanide and extracted with two 30-ml portions of chloroform. Washing the organic layer with 10 ml of sodium cyanide solution followed by three 50 ml portions of water, drying over sodium sulfate, and evaporation to an oil, gave 0.94 g cyano product (85% yield), mp 105.5°–7.5° C, upon recrystallization from hot ethanol/water (1:1).

Bis-1,3(N-carbazolyl)propane Derivatives

EXAMPLE 15

Unsubstituted Compound. To a flame-dried flask, under a nitrogen atmosphere, was added 4.31 g (as 50% mineral oil dispersion, 98.8 mmol) of sodium hydride. After washing with petroleum ether four times, the flask was charged with 100 ml distilled (from lithium aluminum hydride) tetrahydrofuran, and 15 g (89.8 mmol) of carbazole in 1 g portions over 0.5 hour (foamed). After dissolution of the carbazole, 9.07 g (44.9 mmol) of 1,3-dibromopropane was added, and the solution refluxed 5 hours. Upon cooling, 200 ml of water was added, and the product filtered off, air dried, and recrystallized from benzene/ethanol, followed by benzene/acetonitrile, to give 10.6 g (63%), mp 180.5°–2.0° C (lit. mp 186° C).

EXAMPLE 16

Bis-1,3(N-3'-iodocarbazolyl) propane. A solution of 3.74 g (10.0 mmol) of bis-1,3(N-carbazolyl)propane, 2.21 g (13.3 mmol) of potassium iodide, and 1.43 g (6.7 mmol) of potassium iodate in 80 ml of glacial acetic acid was refluxed for 2.5 hours. The product was filtered out of the colorless solution, air dried and recrystallized from tetrahydrofuran/benzene (2:1), followed by chloroform/petroleum ether (1:1) to give 2.2 g (35%), mp 220°–5° C (shrinks at 215° C); analysis for $C_{27}H_{20}N_2I_2$: Cal'd: C, 51.78; H, 3.22; N, 4.47; I, 40.53%. Found: C, 51.46; H, 3.02; N, 4.46; I, 37.3 ± 3%.

EXAMPLE 17

Bis-1,3(N-3',6'-dimethylcarbazolyl)propane. A mixture of 25.0 g (157 mmol) of p-methylphenylhydrazine hydrochloride and 17.6 g (157 mmol) of 4-methylcyclohexanone was stirred overnight in 75 ml of 95% ethanol. The mixture was cooled to 0° C, filtered, and the product recrystallized from ethanol/water to give 20.7 g (66%) of 3,6-dimethyl-1,2,3,4-tetrahydrocarbazole, mp 118.5°–20° C (lit. mp 112° C).

A mixture of 12.0 g (60.3 mmol) of 3,6-dimethyl-1,2,3,4,-tetrahydrocarbazole and 3.6 g of 10% palladium on charcoal (46-190, Strem Chemicals, Danvers, Mass.) in 120 ml xylene was refluxed vigorously (150° C) overnight. Addition of 200 ml of ethyl acetate, filtration of the cooled mixture through Celite 545 and evaporation of solvents gave 11.0 g (94%) of 3,6-dimethylcarbazole, mp 218°–21° C (lit. mp 217°–18° C).

Addition of 3,6-dimethylcarbazole to 1,3-dibromopropane through the agency of sodium hydride in tetrahydrofuran, as described previously for carbazole, gave ca 55% impure bis-1,3(N-3',6'-dimethylcarbazolyl)propane. Recrystallization from chloroform/ethanol, and twice from benzene/petroleum ether gave pure product, mp 169.5°–70.5° C.

EXAMPLE 18

Bis-1,3(N-3'-methoxycarbazolyl)propane. Reaction of p-methoxyphenylhydrazine hydrochloride with cyclohexanone (exothermic) was carried out as for the methyl substituted compound (See Liebigs Ann. der Chemie, 359, 52, 1908) in 82% yield, mp 105°–7.5° C. This compound was dehydrogenated with 10% palladium on charcoal in xylene, as above, to give 74% of 3-methoxycarbazole, recrystallized from benzene/heptane, mp 148.5°–9.5° C (lit. mp 150.5°–1.0° C).

Addition of 3-methoxycarbazole to 1,3-dibromopropane through the agency of sodium hydride in tetrahydrofuran, as described above, gave ca 50% bis-1,3(N-3'-methoxycarbazolyl) propane, crystallized from benzene/ethanol/petroleum ether (2:1:8). Product recrystallized from chloroform/petroleum ether and benzene/ethanol had mp 138°–9.5° C.

EXAMPLE 19

Bis-1,4(N-carbazolyl)butane. A mixture of 3.6 g of powdered sodium hydroxide (90.0 mmol) and 10.0 g of carbazole (60.0 mmol) in 35 ml acetone was stirred at room temperature under nitrogen one-half hour. 6.48 g of 1,4-dibromobutane (30.0 mmol) was added, and the solution refluxed for 20 hours. After cooling, 50 ml of water and enough 4N hydrochloric acid was added to bring to neutrality. Product was filtered off, and recrystallized from tetrahydrofuran, chloroform, and finally benzene (filtered while hot) to give 3.5g, (30% yield) mp 207°–8.5° C (DSC mp 209.0° C, width at half height of 0.8° C).

EXAMPLE 20

Bis-1,5(N-carbazolyl)pentane. Reaction of carbazole, sodium hydroxide, and 1,5-dibromopentane as above gave product, which was twice recrystallized from chloroform, and finally from benzene (filtered while hot) to give 4.0 g (33% yield), mp 177°–9° C (DSC mp 178.9° C, width at half height of 0.9° C).

Preparation of Trinitrofluorenone Complexes

Eastman 2,4,7-trinitrofluorenone (TNF) was recrystallized twice from acetonitrile; uv ($CHCL_3$) nm ($e_{max}$) 252 (21,700), 256 (22,100), 277 (38,700), 286 (sh 295) (39,700), 319 (10,000), 340 (9,900) and 350 (sh 370) (9,800).

Polyvinylcarbazole: TNF Complexes

An equimilar solution of the substituted polyvinylcarbazole and TNF (ca 10% total solids) in tetrahydrofuran, distilled from lithium aluminum hydride, was stirred for over an hour to effect total dissolution. The solutions are highly colored because of a charge-transfer absorption in the visible region of 450–600 nm, which seem to be humps superimposed on the large tail-off absorptions above 350 nm for carbazole and for TNF. Approximate absorption characteristics follow, as described by the shoulder absorption. Unsubstituted PVK-540 nm; dibromo-PVK-540 nm; iodo-PVK-580 nm; acetylamino-PVK-450, 590 nm. These values are not precise, but illustrate the trend in charge-transfer PVK donor ability versus substituent.

N-Ethylcarbazole: TNF Complexes

These solid crystalline complexes were generally prepared by mixing hot 0.1 to 0.2 molar acetonitrile (ACS grade) solutions of purified N-ethylcarbazole derivative and of 2,4,7-trinitrofluoenone in equal molar proportion. Deep brown to black precipitates of the 1:1 complexes separate out upon cooling, which were vacuum dried and characterized by sharp melting point determinations (no melting at the individual component mp's occurred) and by elemental analyses.

EXAMPLE 21

N-Ethylcarbazole: TNF. Deep brown needles (80%); analysis: Cal'd for $C_{27}H_{18}N_4O_7$; C, 63.53; H, 3.55; N, 10.98%. Found; C, 62.40; H, 3.37; N, 11.28%, the melting point in this case was determined via DSC and consisted of two sharp endotherms at 165° and 168,5° C (mp N-ethylcarbazole, 76° C; TNF, 176° C).

EXAMPLE 22

3-Nitro-N-ethylcarbazole: TNF. Deep-orange microcrystals (62%) mp 169.5°–70.5° C (mp 3-nitro-N-ethylcarbazole, 119°–21° C; TNF, 176° C).

EXAMPLE 23

3-Dibenzylamino-N-ethylcarbazole: TNF. Black flakes (62%); mp 148°–9.5° C (mp 3-dibenzylamino-N-ethylcarbazole, 122.5°–4.5° C; TNF, 176° C); analysis: Cal'd for $C_{41}H_{31}N_5O_7$; C, 69.77; H, 4.42; N, 9.92%. Found: C 69.68; H, 4.22; N, 10.01%.

EXAMPLE 24

3-Acetylamino-N-ethylcarbazole: TNF. Deep brown microcrystals (75%); mp 208°–10° C (mp 3-acetylamino-N-ethylcarbazole, 204° C; TNF, 176° C).

EXAMPLE 25

3-Cyano-N-ethylcarbazole; TNF. Orange microneedles (65%) mp 183°–5° C (mp 3-cyano-N-ethylcarbazole, 105.5°–7.5° C; TNF, 176° C).

EXAMPLE 26

3-Diphenylamino-N-ethylcarbazole; TNF. Water had to be added (10:1 acetonitrile/water) in order to precipitate the complex; jet-black prisms (92%); mp 152.5°–4° C (mp 3-diphenylamino-N-ethylcarbazole, 132.5°–5° C; TNF, 176° C); mp by DSC 149.5° C (single endotherm).

Bis-1,ω(N-carbazolyl)alkane; TNF Complexes

These complexes were prepared in the same way as the N-ethylcarbazole complexes, i.e., mixing hot 0.05 to 0.1 molar acetonitrile solutions of purified biscarbazole derivatives with a 2-molar amount of hot 2,4,7-trinitrofluorenone solution. The precipitate of 2 TNF to 1 biscarbazole complex was filtered from solution and vacuum dried. The materials were characterized by mp, ir, and elemental analysis.

EXAMPLE 27

Bis-1,3-(N-carbazolyl)porpane; 2TNF. Red-brown flakes (97%); mp 233°–4.5° C (mp carbazolylopropane, 180.5°–2.0° C; TNF, 176° C); DSC melting gave two very closely spaced sharp endotherms (2° C half-width) at 235° and 236° C. Analysis for $C_{53}H_{33}N_8O_4$; Cal'd: C, 63.34, H, 3.21; N, 11.16%. Found: C, 63.45; H, 3.22; N, 11.33%

EXAMPLE 28

Bis-1,3-(N-3'-iodocarbazolyl)propane: 2TNF. This product precipitated out of a 0.05 molar chloroform solution of the propane, 0.1 molar in TNF, as maroon granular crystals (72%) only after reducing solution volume to 5 ml for 1 g complex; mp 180°–1° C (shrunk at 170° C, mp carbazolylpropane, 220°–5° C; TNF, 176° C); DSC melting gave a sharp peak on a broad base (half-width 2° C, quarter-width 5-1/2° C) at 179° C. Analysis for $C_{53}H_{30}N_8I_2O_{14}$: Cal'd: C, 50.65; H, 2.41; N, 8.92%. Found: C, 50.91; H, 2.46; N, 8.81%.

EXAMPLE 29

Bis-1,3(N-3',6'-dimethylcarbazolyl)propane: 2TNF. Dark-brown flakes (100%); mp 209.5°–10.5° C (mp carbazolylpropane, 169.5°–70.5° C; TNF, 176° C).

EXAMPLE 30

Bis-1,3(N-3'-methoxycarbazolyl)propane: 2TNF. Olive-green flakes (82%) mp 153.5°–5.5° C (mp of carbazolylpropane, 138°–9.5° C; TNF 176° C).

EXAMPLE 31

Bis-1,3(N-3',6'-dibromocarbazolyl)propane: Deep red microcrystals, (73% yield), mp 228° C. Analysis $C_{53}H_{28}N_8Br_4O_{14}$; Calc: C-48.21, H-2.14; N-8.49, Br-24.21; Found: C-48.38, H-2.16, N-8.82, Br-24.0.

EXAMPLE 32

Bis-1,4-(N-carbazolyl)butane: 2TNF. A boiling solution of 3.00 mmol of TNF in 15 ml acetonitrile was added to a boiling solution of 1.50 mmol of the carbazole in 15 ml of 2:1 acetonitrile/benzene. Brown flakes were filtered from the cooled solution, washed and dried in vacuo at 40° C, mp 215°–7° C (mp of carbazolylbutane 207°–8.5° C; mp TNF, 176° C); DSC mp 214° C (width of half height 2° C)

EXAMPLE 33

Bis-1,5(N-carbazolyl)pentane: 2TNF, This complex was prepared as the butane compound, except that the carbazole was dissolved in 35 ml of 5:1 acetonitrile/benzene. Deep brown flakes were obtained, mp 218.5°–20° C (mp of carbazolylpentane 177°–9° C; TNF, 176° C); mp by DSC −217.5° C.

All of the derivatives of this invention were prepared from one pure polyvinylcarbazole sample by reaction with appropriate inorganic reagents and then carefully purified by recrystallization. Therefore, they differ only by nature of the chemical appendages on the polymer backbone and the extent to which these affect polymer morphology. Since all the polymers are formed into films under similar conditions and since heating near the glass transition temperature has a minimal effect on relative photoconductivities, all the polymers are completely amorphous and have similar gross structure.

The following examples demonstrate use of selected compounds and complexes as charge transfer materials:

EXAMPLE 34

In the following examples the photoconductivity of compounds was investigated and photocurrent and light resistivity capabilities determined. In these examples, the indicated N-ethylcarbazole: TNF complex was precipitated from solution as the 1:1 TNF complex, ground into submicron particles and suspended in DuPont Elvacite ®, (a mixture of a normal- and isobutylmethacrylate) binder at 20-35% concentration. The cells were then formed by application with a doctor blade on a NESA square, dried to 10 micron thickness and applying a gold counter electrode. The intensity of irradiation from a white light source was in the range of $5 \times 10^4$ volts per centimeter electric field strength and $4.5 \times 10^{16}$ photons per square centimeter per second. The conditions and the results from the experiment are set forth in the following Table I.

TABLE I
PHOTOCONDUCTIVITY OF SUBSTITUTED N-ETHYLCARBAZOLE:TRINITROFLUORENONE CELLS

| Ex. | Carbazole in Complex (% Binder) | Photocurrent (A/cm$^2$) | Light Resistivity | Delta[b] |
|---|---|---|---|---|
| 34-A | N-Ethylcarbazole:TNF[a] (20) | $6.5 \times 10^{-10}$ | $7 \times 10^{13}$ | 1.5 |
| 34-B | 3-Nitro-N-ethylcarbazole:TNF (29) | $7.8 \times 10^{-7}$ | $6.4 \times 10^{10}$ | 50 |
| 34-C | 3-Cyano-N-ethylcarbazole:TNF (29) | $2.2 \times 10^{-7}$ | $2.3 \times 10^{11}$ | 3 |
| 34-D | 3-Acetylamino-N-ethylcarbazole:TNF (35) | $1.7 \times 10^{-9}$ | $3 \times 10^{14}$ | 10 |
| 34-E | 3-Dibenzylamino-N-ethylcarbazole:TNF (29) | $7.8 \times 10^{-7}$ | $6.4 \times 10^{10}$ | 2 |

Notes:
[a]Complex embedded in DuPont Elvacite ®(n- and i- butylmethacrylate) polymer; Gold (+)/Nesa (−) electrodes in sandwich cell; $F=5 \times 10^4$V/cm; $4.5 \times 10^{16}$ photons/cm$^2$-sec. White light source used.
[b]Ratio of light to dark current.
[a]$4 \times 10^{14}$ Photons/cm$^2$-sec. of 450nm light used.

EXAMPLE 35

In the following example the photoconductivity of substituted bis-carbazolylpropane: trinitrofluorenone complexes in polymethacrylate cells were investigated in order to determine the photocurrent and light resistivity capabilities. The cells were prepared as described in Example 34. the results are set forth in the following Table II.

TABLE II
PHOTOCONDUCTIVITY OF SUBSTITUTED BISCARBAZOLYLPROPANE: 2-TRINITROFLUORENONE (BCP:2TNF)/POLYMETHACRYLATE CELLS[a]

| Ex. | Photoconductor (% Binder) | Photo-Current (A/cm$^2$) | Light Resistivity (ohm-cm) | Decay Time[b] (sec) |
|---|---|---|---|---|
| 35-A | BCP:2TNF (23) | $5.7 \times 10^{-6}$ | $9 \times 10^9$ | 7 |
| 35-B | BCP:2TNF in PVK (27) | $7.0 \times 10^{-6}$ | $7 \times 10^9$ | <<1 |
| 35-C | 3'-Bisiodo BCP:2TNF (29) | $9.7 \times 10^{-6}$ | $5 \times 10^9$ | 7 |
| 35-D | 3'-Bismethoxy BCP:2TNF (29) | $1.0 \times 10^{-7}$ | $5 \times 10^{11}$ | — |
| 35-E | 3',6'-Bisdimethyl BCP:2TNF (29) | $5.0 \times 10^{-8}$ | $1.0 \times 10^{12}$ | 22 |

Notes:
[a]Same as note a) of Table I.
[b]Decay to 1/e-37% of photocurrent after cessation of excitation.

EXAMPLE 36

In this example the photoconductivity of substituted carbazole dimers were investigated, which dimers were complexes with trinitrofluorenone in polyvinyl ketone cells. The experiments were carried out by placing the finely divided substituted bis-N-carbazolyl alkanes suspended in the polyvinyl ketone binder in 73 weight percent concentration and forming a NESA/Gold sandwich cell. A white tungsten iodine lamp of intensity $3.35 \times 10^{16}$ photons per square centimeter per second was used as the light source and the electric field strength with $5.0 \times 10^4$ volt per centimeter. The complete white light data from these experiments are set forth in the following Table III:

TABLE III
PHOTOCONDUCTIVITY OF SUBSTITUTED CARBAZOLE-DIMER: 2TNF/PVK CELLS[a]

| Ex. | Photoconductor | Photocurrent (A/cm$^2$) +Nesa | Photocurrent (A/cm$^2$) −Nesa | Gain,Φ($\times 10^{-3}$) +Nesa | Gain,Φ($\times 10^{-3}$) −Nesa | Light Resistivity (ohm-cm$\times 10^{10}$)[b] +Nesa | Light Resistivity (ohm-cm$\times 10^{10}$)[b] −Nesa |
|---|---|---|---|---|---|---|---|
| 36-A | BCP:2TNF | $2.9 \times 10^{-6}$ | $5.9 \times 10^{-6}$ | $0.54 \pm 0.15$ | $1.10 \pm 0.3$ | $1.9 \pm 0.5$ | $0.92 \pm 0.3$ |
| 36-B | 3'-Bisiodo BCP:2TNF | $1.25 \times 10^{-5}$ | $1.96 \times 10^{-5}$ | $2.34 \pm 0.54$ | $3.7 \pm 1.1$ | $3.8 \pm 1.1$ | $2.6 \pm 0.7$ |
| 36-C | 3',6'-Bis-dibromo BCP:2TNF | $1.40 \times 10^{-6}$ | $2.09 \times 10^{-6}$ | $0.26 \pm 0.08$ | $0.39 \pm 0.10$ | $0.44 \pm 0.11$ | $0.28 \pm 0.08$ |
| 36-D | BCP:2TNF in PVK:TNF Binder | $7.5 \times 10^{-7}$ | $7.9 \times 10^{-7}$ | $0.14 \pm 0.02$ | $0.15 \pm 0.02$ | $6.7 \pm 0.5$ | $6.3 \pm 0.4$ |
| 36-E | Bis-1,4-(N-carbazolyl)-butane: 2TNF | $1.61 \times 10^{-6}$ | $2.86 \times 10^{-6}$ | $0.30 \pm 0.03$ | $0.53 \pm 0.04$ | $3.1 \pm 0.2$ | $1.8 \pm 0.1$ |
| 36-F | Bis-1,5(N-carbazolyl)-pentane: 2TNF | $0.93 \times 10^{-6}$ | $3.75 \times 10^{-6}$ | $0.17 \pm 0.05$ | $0.71 \pm 0.12$ | $6.2 \pm 2.3$ | $1.37 \pm 0.18$ |

Notes:
[a]Fieldl=$5.0 \times 10^4$V/cm; BCP=Bis-1,3(carbazolyl)propane.
[b]Dark resistivity is ca $10^{14}$ for the BCP compounds and ca $10^{13}$ for the butane and pentane compounds.

The invention has been described with reference to certain preferred embodiments; however, as obvious variations thereon will become apparent to those skilled in the art, the invention is not to be considered as limited thereto.

What is claimed is:

1. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

wherein R is ethyl and X is nitro.

2. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

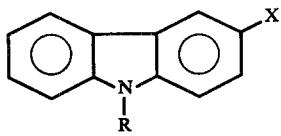

wherein R is ethyl and X is acetylamino.

3. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

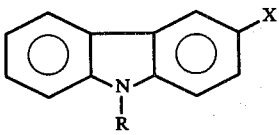

wherein R is ethyl and X is dibenzylamino.

4. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

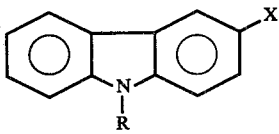

wherein R is ethyl and X is iodo.

5. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

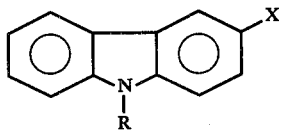

wherein R is ethyl and X is diphenylamino.

6. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

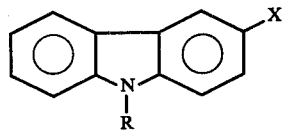

wherein R is ethyl and X is cyano.

7. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

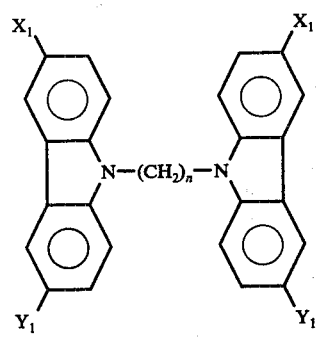

wherein $X_1$ is hydrogen, $Y_1$ is iodo and $n$ is 3.

8. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

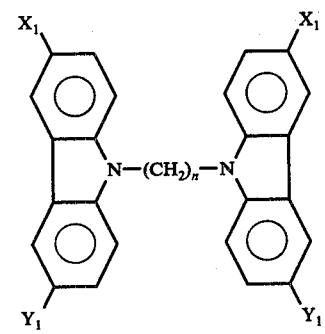

where $X_1$ and $Y_1$ are methyl, and $n$ is 3.

9. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

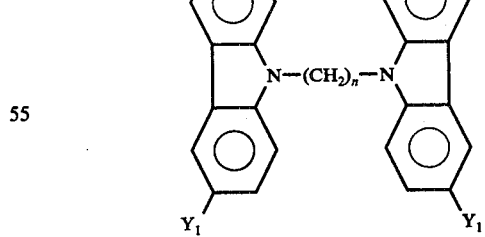

where $X_1$ is hydrogen, $Y_1$ is methoxy, and $n$ is 3.

10. A photoconductive, charge-transfer material comprising a complex of an electron acceptor molecule selected from the group consisting of 2,4,7-trinitro-9-fluorenone and 2,4,5,7-tetranitro-9-fluorenone, with a carbazole compound of the following formula:

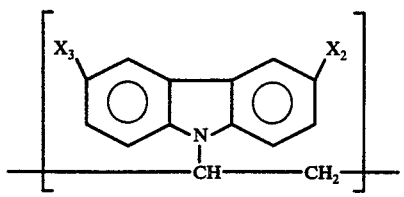

wherein $X_2$ is selected from the group consisting of bromo, iodo, nitro, amino, N-acetylamino, N,N-dibenzylamino, cyano, diphenylamino, formyl, acetyl, methyl, and methoxy, $X_3$ is hydrogen, or bromo when $X_2$ is bromo, and $m$ is an integer indicating the polymer chain length.

11. A charge-transfer material according to claim 10 where $X_2$ and $X_3$ are bromo.

12. A charge-transfer material according to claim 10 where $X_2$ is iodo and $X_3$ is hydrogen.

13. A charge-transfer material according to claim 10 where $X_2$ is nitro and $X_3$ is hydrogen.

14. A charge-transfer material according to claim 10 where $X_2$ is acetylamino and $X_3$ is hydrogen.

15. The compound, 3-Dibenzylamino-N-ethylcarbazole.

16. The compound, 3-Diphenylamino-N-ethylcarbazole.

17. The compound, Bis-1,3-(N-3'-iodocarbazolyl)propane.

18. The compound, Bis-1,3-(N-3'-methoxy-carbazolyl)propane.

19. The compound, Bis-1,3(N-3',6'-dibromocarbazolyl)propane.

* * * * *